United States Patent [19]
Carbonneau

[11] Patent Number: 5,791,485
[45] Date of Patent: Aug. 11, 1998

[54] ELECTROSTATIC DISCHARGE PROTECTION BAG

[75] Inventor: Alan J. Carbonneau, Marlborough, Mass.

[73] Assignee: Raytheon Company, Lexington, Mass.

[21] Appl. No.: 786,015

[22] Filed: Jan. 21, 1997

Related U.S. Application Data

[63] Continuation of Ser. No. 327,756, Oct. 24, 1994, abandoned.

[51] Int. Cl.[6] .......................... B65D 30/02; B65D 81/03
[52] U.S. Cl. ...................... 206/720; 206/204; 206/523
[58] Field of Search .............................. 206/204, 521, 206/522, 523, 720; 383/61

[56] References Cited

U.S. PATENT DOCUMENTS

| | | | |
|---|---|---|---|
| 3,473,589 | 10/1969 | Gotz | 383/61 |
| 3,868,056 | 2/1975 | Keren | 206/521 |
| 4,223,368 | 9/1980 | Dattilo | 361/220 |
| 4,427,114 | 1/1984 | Howell et al. | 206/328 |
| 4,471,872 | 9/1984 | Dedow | 206/720 |
| 4,906,494 | 3/1990 | Babinee et al. | 206/720 |
| 4,915,222 | 4/1990 | Reidinger et al. | 206/328 |
| 4,987,997 | 1/1991 | Raszewski et al. | 206/720 |
| 5,025,922 | 6/1991 | Havens et al. | 206/720 |
| 5,110,669 | 5/1992 | Knobel et al. | 206/720 |
| 5,137,154 | 8/1992 | Cohen | 206/522 |
| 5,174,658 | 12/1992 | Cook | 383/61 |
| 5,195,302 | 3/1993 | Collantes, Jr. et al. | 53/442 |
| 5,318,181 | 6/1994 | Stover et al. | 206/459.1 |

FOREIGN PATENT DOCUMENTS

| 220556 | 9/1991 | Japan | 206/204 |
|---|---|---|---|

*Primary Examiner*—Stephen P. Garbe
*Attorney, Agent, or Firm*—Judith C. Crowley; Nutter, McClennen & Fish LLP

[57] ABSTRACT

A multilayer protection bag for protecting an electronic module, circuit card, or the like comprising walls having an external first layer of an antistatic shield film, a second layer of static-free bubble pack, and a third layer of a static-free film forming an interior liner of the protection bag to inhibit corrosion and outgassing. A mechanical cushioning bumper is provided around the perimeter of the sides and bottom of the protection bag for shock protection. A moisture proof pinch type zip lock is provided on the top of the protection bag. A carrier is provided within the protection bag for holding a desiccant and a humidity indicator. The combination of such wall layers and the cushioning bumper provide an improved in-process protection bag during a manufacturing process and also a shipping and storage protection bag having at least a 10 year shelf-life for a module or circuit card placed within it.

9 Claims, 3 Drawing Sheets

ELECTROSTATIC DISCHARGE PROTECTION BAG

This application is a continuation of application Ser. No. 08/327,756 filed Oct. 24, 1994 now abandoned.

BACKGROUND OF THE INVENTION

This invention relates to a protection package for handling and storing products subject to damage by static electricity discharge, shock, corrosion and contamination, and in particular to a multilayer protection bag for handling and storing an electronic module or circuit card product comprising semiconductor devices or similar devices subject to possible damage through discharges of static electricity, shock, corrosion or contamination.

During the manufacturing process of an electronic module or a circuit card product comprising semiconductor devices, the need to protect such product from electrostatic discharge and from physical shock and vibration is well known. The article of manufacture such as an electronic module or circuit card product may be handled many times during each state of assembly and test. In order to prevent damage to the module or circuit card, procedures have been used whereby a module or circuit card is inserted in a clean room type of non-outgassing, non-static generating protection bag to protect against contamination and charge build-up; next, the protection bag is wrapped in antistatic foam to cushion against shock and vibration due to handling, and then the foam is inserted in a static shielding protection bag with metalization to protect the module or circuit card from external sources of static electricity. This protection procedure requires the stocking of several parts, requires considerable handling, and provides opportunities for costly mistakes to occur. Further, at the end of the manufacturing process including test, the manufactured product is re-packaged for shipping or storage with protection materials similar to those used during the manufacturing process, except the outer shielding protection bag requires heat sealing. An additional layer of cushioning foam is required within a rigid container or box for shipping. A single protection bag that provides all of the above protections and that is suitable for shipping and storage is highly desirable for efficiency and reduced costs.

A cushion pouch for providing protection to electronic modules from handling and certain electrical fields is sold by PROTEK Solutions, of Chelmsford, Mass. This pouch comprises inside and outside walls made from a static-free polyethylene film with a conductive film sandwiched between the polyethylene film and a bubble pack material. However, this pouch does not protect against static electricity discharges, 5 g mechanical forces and outgassing. It also is not suitable for long term storage of electronic modules.

SUMMARY OF THE INVENTION

Accordingly, it is therefore an object of this invention to provide a single protection, multilayer bag for insertion of an electronic module or circuit card comprising semiconductor devices to protect against a plurality of adverse conditions including electrostatic discharge, corrosion, contamination and mechanical forces including shock.

It is a further object of the invention to provide for mechanical shock protection by employing a bumper means around a majority of the perimeter of the protection bag.

It is a further object of the invention to provide a protection bag, having a carrier within an upper inside portion of the protection bag, with one or more compartments for holding a desiccant and a humidity monitor.

It is a further object of the invention to provide a protection bag with an extremely long shelf life wherein the electrostatic discharge characteristics remain stable under extreme arid conditions for periods of at least ten years.

The objects are further accomplished by an enclosure for protecting an electronic unit comprising opening means in the enclosure for inserting and removing the electronic unit, wall means for enclosing the electronic unit, the wall means comprising a plurality of layers of materials including an antistatic material for protecting the electronic unit against a plurality of adverse conditions including electrostatic discharge, corrosion, contamination and mechanical forces including shock, cushioning means disposed around a portion of the perimeter of the enclosure for protecting against the mechanical forces being applied to the enclosure and the electronic unit inside the enclosure. The enclosure comprises a carrier means for holding at least one item inside the enclosure and separate from the electronic unit. The opening means of the enclosure comprises means for closing the enclosure. The enclosure comprises film means contiguous to the opening and closing means for providing a barrier to seal the opening side of the enclosure. The wall means comprises an inside layer of a corrosion inhibiting, non-outgassing film.

The objects are further accomplished by a bag for protecting an electronic unit comprising means for opening the bag for insertion of the electronic unit and for closing the bag to exclude moisture and contaminating materials, a first wall of the bag comprises antistatic means positioned as a first external surface side of the bag for protecting against electrostatic discharge, a first film means positioned as an internal surface of the first wall for inhibiting corrosion and outgassing, a first cushion means disposed between the antistatic means and the first film means for protecting against mechanical forces exerted on the bag, a second wall facing the first wall and being attached to the first wall along perimeters of the first wall and the second wall, except in the area of the opening means, thereby forming the bag, the second wall positioned as a second external surface side of the bag comprises an antistatic means for protecting against the electrostatic discharge, a second film means positioned as an internal surface of the second wall for inhibiting corrosion and outgassing, a second cushion means disposed between the antistatic means and the second film means for protecting against the mechanical forces, and a third cushion means disposed around the perimeter of the bag, except in the area of the opening means, for protecting against the mechanical forces. The first wall is attached to the second wall by heat sealing means. The bag comprises a carrier means for holding at least one item inside the bag and separate from the electronic unit. The carrier comprises a compartment for holding a desiccant. The first cushion means and the second cushion means comprise a static-free bubble pack means. The third cushion means comprises a static-free bubble pack means covered by the antistatic means. The antistatic means comprises a multilayer film having a metalization material in-between two layers of antistatic film. The first film means and the second film means comprise a corrosion inhibiting non-outgassing film.

The objects are further accomplished by a method of providing an enclosure for protecting an electronic unit comprising the steps of providing an opening means in the enclosure for inserting and removing the electronic unit, enclosing the electronic unit with wall means, the wall means comprising a plurality of layers of materials including an antistatic material for protecting the electronic unit against a plurality of adverse conditions including electrostatic discharge, corrosion, contamination and mechanical forces including shock, and disposing around a portion of the perimeter of the enclosure a cushion means for protecting against the mechanical forces being applied to the enclosure and the electronic unit inside the enclosure. The method comprises the step of providing a carrier means for holding at least one item inside the enclosure and separate from the electronic unit. The step of providing a carrier means comprises the step of providing a desiccant in the carrier means. The step of providing a carrier means comprises the step of providing a humidity indicator in the carrier means. The step of providing an opening means comprises the step of closing the opening means of the enclosure. The method comprises the step of sealing an antistatic film means contiguous to the opening means to enable long term storage of the electronic unit.

DESCRIPTION OF THE PREFERRED EMBODIMENT

Figure 1:
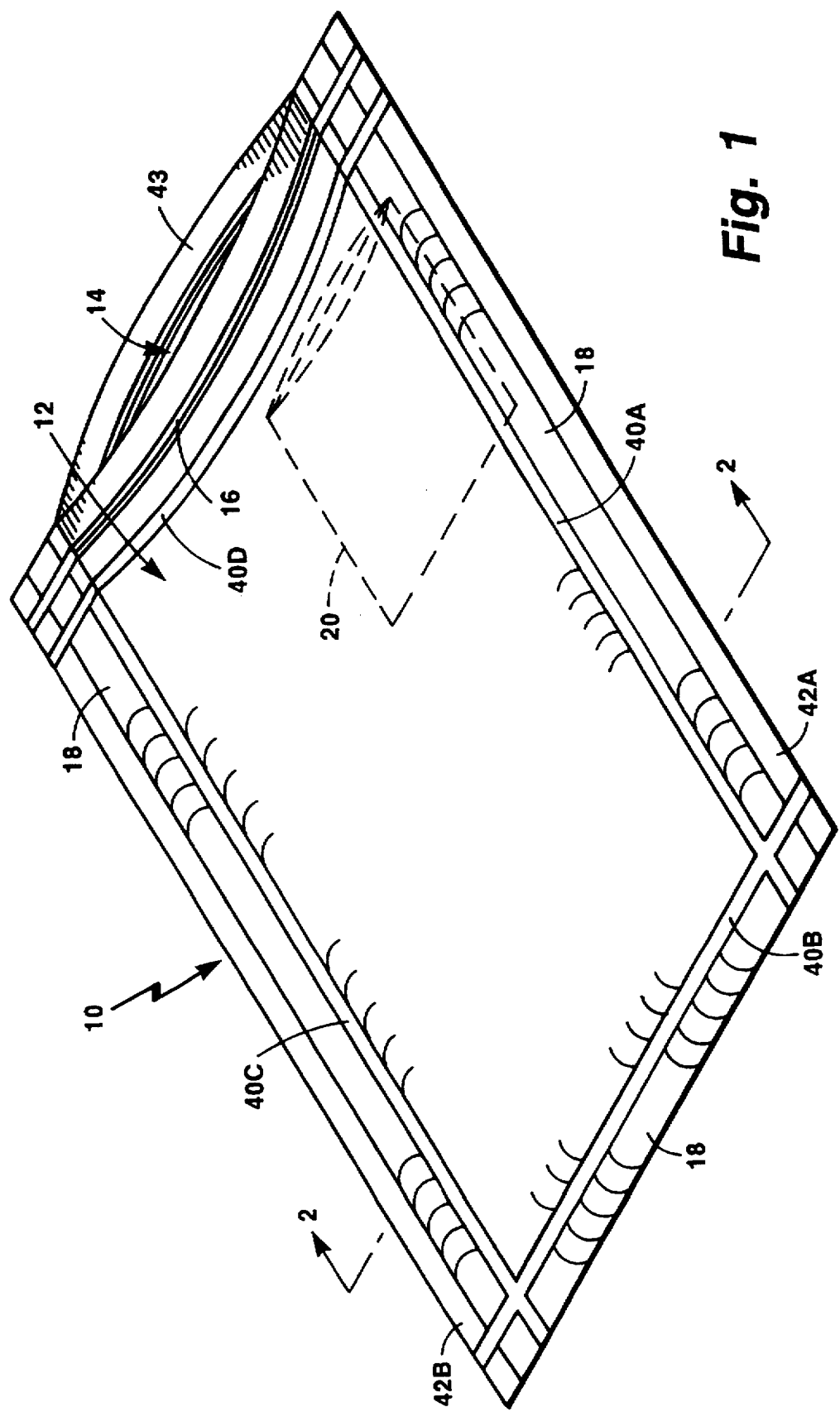
FIG. 1 is an isometric view of a multilayer protection bag in accordance with the present invention.

Referring now to FIG. 1, an electrostatic discharge protection bag 10 for use with an electronic module or circuit card product having semiconductor devices or similar devices attached thereto is shown. The protection bag 10 provides a combination of protection against electrostatic discharge (ESD), corrosion, contamination and mechanical forces including shock and vibration. The protection bag 10 comprises a front or first wall 12 and a rear or second wall 14. The walls 12 and 14 are multilayered with the same materials. An opening of the protection bag 10 for inserting an electronic module or circuit card is closed by means of a moisture proof, pinch type zip lock 16. A bumper border 18 approximately one inch wide is disposed around the perimeter of the protection bag 10 except in the pinch zip lock 16 area. The bumper border 18 provides the means for cushioning mechanical forces that occur, for example, when the protection bag 10 is dropped. Adjacent to the bumpers 18 on two sides of the protection bag 10 are edge seals 42A and 42B which provide for enhanced seam strength. Also, above the zip lock 16 is approximately a ⅞ inch extension 43 of the external surfaces of first wall 12 and second wall 14, which forms a barrier and may be sealed for long term storage of the protection bag 10. The protection bag 10 shown in FIG. 1 has outside dimensions of 13.0 inches by 17.0 inches and inside dimensions of 9.5 inches by 14.0 inches; such dimensions are based on a size which will accommodate multiple module sizes and shapes.

Figure 2:
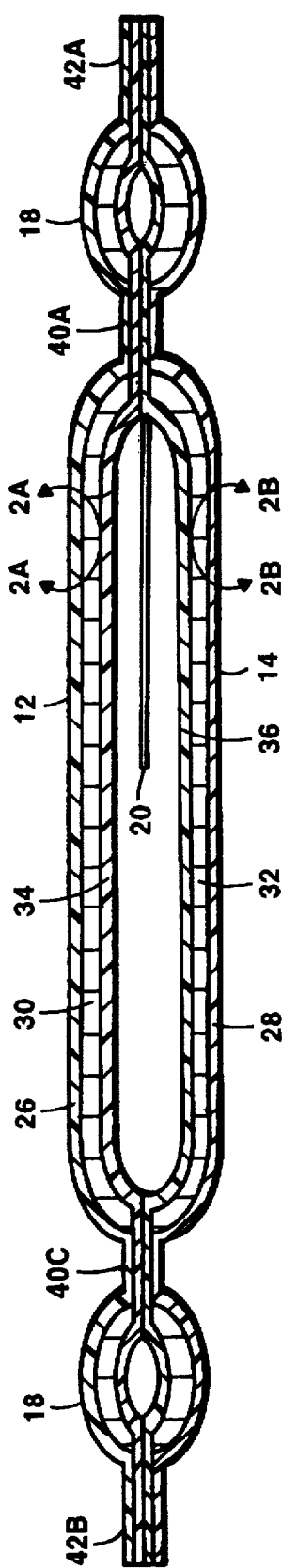
FIG. 2 is an exploded cross-sectional view of the multilayer protection bag showing the plurality of layers of the walls.
Figure 2B:
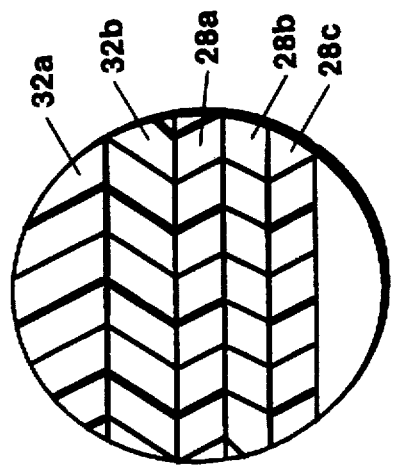
FIG. 2B is an exploded view of a portion of the second wall of the protection bag of FIG. 2.
Figure 2A:
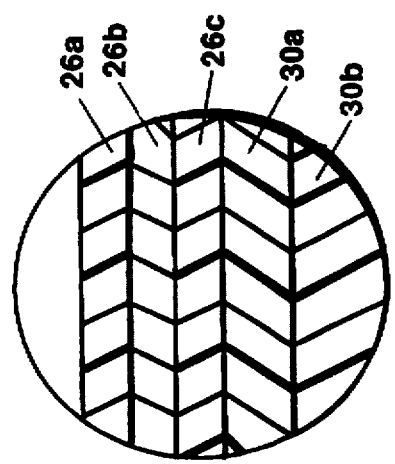
FIG. 2A is an exploded view of a portion of the first wall of the protection bag of FIG. 2.

Referring now to FIG. 1 and FIG. 2, FIG. 2 is an exploded cross-sectional view of the electrostatic discharge protection bag 10 shown in FIG. 1 along lines 2—2 in FIG. 1. The first wall 12 and the second wall 14 of protection bag 10 comprises multilayers of materials. The bumper borders 18 are constructed similarly. The external surface walls of the protection bag 10 comprises a multilayer film 26, 28 with metalization sandwiched between antistatic films; this multilayer film provides ESD shielding and limited electromagnetic interference (EMI) attenuation. The external material meets the requirements of MIL-B-81705 type III film and may be embodied by MIL qualified film such as Type III film manufactured by Metalization Products, of Winchester, Mass. The interior surfaces of protection bag 10 comprise a corrosion inhibiting, non-outgassing film 34, 36 which exceeds the requirements of MIL-B-81705 type II such as charge decay, tribogeneration, outgassing and aging, and may be embodied by Static Intercept™ film, provided by PROTEK Solutions, of Chelmsford, Mass. 01824. The Static Intercept™ film is a material developed by AT&T Bell Laboratories and manufactured by Engineered Materials, Inc. of Buffalo Grove, Ill. Static Intercept™ comprises a polymeric material, such as polyethylene, having carbon black and a metal, such as copper, iron, cobalt, manganese and alloys of these metals, reacted into the polymer matrix as described in a U.S. Pat. No. 5,154,886. Sandwiched between the external film 26, 28 and internal film 34, 36 of the walls 12, 14 of protection bag 10 are non-static generating bubble pack layers 30, 32 comprising two bubble layers facing each other. Standard PPP-C-1842 type bubble pack is used. The bubble pack layers 30, 32 in conjunction with the bumper 18 design, provide mechanical force protection up to 5 g from a drop of 36 inches; they also provide for a smooth interior surface of protection bag 10 for ease of sliding a product in and out of the protection bag 10, thereby providing protection from "popping" individual bubbles. The bubble pack layers 30, 32 may be embodied by Cancel® cushioning material distributed by Sealed Air Corporation, of Fair Lawn, N.J. The Cancel® cushioning material is a registered trademark of ADE, Inc. FIG. 2A is an exploded view of the portion of the first wall 12 of the protection bag 10 surrounded by line 2A—2A of FIG. 2 and including multilayer film 26 and bubble pack layer 30. FIG. 2B is an exploded view of a portion of the second wall 14 of the protection bag 10 surrounded by line 2B—2B of FIG. 2 and including multilayer film 28 and bubble pack layer 32. In particular, FIG. 2A shows the three layers of multilayer film 26 including antistatic film layers 26a and 26c and metalization layer 26b sandwiched therebetween. FIG. 2A further shows the two bubble pack layers 30a, 30b comprising bubble pack layer 30. FIG. 2B similarly shows the three layers of multilayer film 28 including antistatic film layers 28a and 28c and metalization layer 28b sandwiched therebetween. FIG. 2B further shows the two bubble pack layers 32a, 32b comprising bubble pack layer 32.

Figure 3:
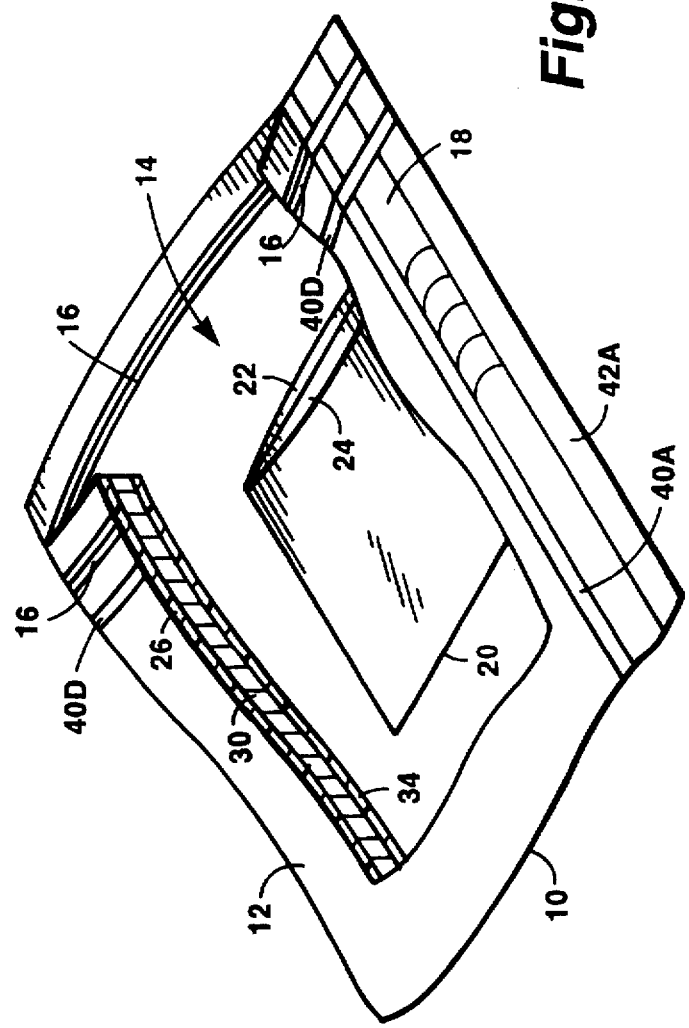
FIG. 3 is a cut away of the multilayer protection bag showing a carrier with two compartments attached to an inside edge of the protection bag.

Referring now to FIG. 3, a cut away of the first wall 12 of electrostatic discharge protection bag 10 is shown exposing a multi-compartment, breathable carrier 20 having two compartments 22, 24. One compartment 22 is provided for holding a desiccant and the other compartment 24 for holding, for example, a humidity indicator. The number of compartments is determined by a particular application of the protection bag 10. The carrier 20 is connected in the upper half of protection bag 10 at an interior edge seam, and in the embodiment shown, the carrier 20 measures 4.0 inches by 4.5 inches. Due to the position of carrier 20 in the protection bag 10, its contents, when of sufficient size, are unable to fall out of the compartments 22, 24 when zip lock 16 of protection bag 10 is closed. The carrier 20 is embodied by a transparent, non-static generating, non-outgassing film described as Cryovac 227 and manufactured by W. R. Grace & Company, of Duncan, S.C. 29334.

Referring again to FIG. 1, the bumper border 18 on three sides of the perimeter of electrostatic discharge protection bag 10 facilitates protecting a product within the protection bag 10 from damage by a 5 g force on the x, y and z axes of the protection bag 10 when dropped from a distance of 36 inches. The bumper border 18 also adds mechanical strength to all seams of the protection bag 10 prohibiting delamination and increasing useful life for reuse programs. The moisture proof zip lock 16 closure attached at the protection bag 10 opening may be embodied by typical antistatic zip locks, manufactured by major industrial packaging companies such as Sealed Air Company of Fair Lawn, N.J., or Wescorp Industries of Mountain View, Calif. 94041.

The construction of the electrostatic discharge protection bag 10 is accomplished by a heat sealing process readily known in the art of bag manufacturing. The materials are cut to the desired size and placed in layers as shown in the exploded cross-sectional view of FIG. 2 with the carrier 20 positioned as shown in FIG. 3 between the interior surfaces of walls 12, 14. Heat knives laminate the protection bag 10 seams 40A, 40B, 40C and 40D forming the internal size of the protection bag 10. Edge seals 42A and 42B are formed on two outer edges of the protection bag 10, and film material, which is an extension 43 of the external film 28, is provided above the zip lock on both sides for future sealing for long term storage. This process is known to one of ordinary skill in the art. The construction of this invention is simple and inexpensive but provides an electronic module or circuit card product with improved protection against electrostatic discharge as well as mechanical shock and vibration; it also protects against corrosion and contamination due to outgassing. The electrostatic discharge protection bag 10 not only is used during the manufacturing process of the product, but also serves as a shipping container for the product with a shelf life of at least 10 years even in severe environments.

The tests performed on a protection bag 10 according to this invention are set forth in the Appendix.

This concludes the description of the preferred embodiment. However, many modifications and alterations will be obvious to one of ordinary skill in the art without departing from the spirit and scope of the inventive concept. Therefore, it is intended that the scope of this invention be limited only by the appended claims.

APPENDIX

Mechanical and electrostatic discharge tests were performed on the electrostatic discharge protection bag 10 to evaluate its effectiveness. These tests and the results were as follows:

Mechanical Tests:
Seam strength Test: A five pound weight was clamped to the specimen imparting an acting load on the seam for five minutes with no visible evidence of delamination.
Waterproof test: The protective bag was wrinkled and flexed. The zip lock was open and closed fifty times. A piece of absorbent paper was placed inside the protection bag and the zip lock of the protection bag was closed. The protection bag was then placed entirely into water containing a violet dye for ten minutes. The absorbent paper was then removed from the protection bag and examined for dye stains; there were no stains.
Contamination transfer test: Clean aluminum foil inside the protection bag 10 showed no evident of contamination or haze after exposure to relative humidity greater than 75% for seventy-two hours.
Outgassing test: For materials making intimate contact with electronic modules (films 34, 36 in FIG. 2 and desiccant carrier 20) on open protection bag 10 was conditioned at ambient for twenty-four hours. An aluminum collector plate (disc) was placed inside the protection bag 10.

The open protection bag 10 was placed in a test chamber at pressure of six torr. The chamber was temperature cycled from cold to hot to cold (22° C. to 100° C. to 22° C.) for a duration of twenty-four hours. The collector plate was examined for haze and there was none. Haze on the collector plate would indicate failed material. The protection bag 10 was then weighed. The collector plate was then weighed. The weights were compared to pre-test weights. The protection bag 10 had a total weight loss of less than 1%. The collector weighed no more than a 0.1% increase; these are considered the volatile outgassing material limits.

Aging test: Mechanical testing and electrical testing were repeated on the protective bag 10 exposed to 90% relative humidity at 100° F. for eight hours and 10% relative humidity at 160° F. for eight hours for a total of five days; there were no shifts in electrical performance upon retest.

Shock test: Protection bag 10 with an electronic module inside weighing 3.5 lbs. was dropped repeatedly from a distance of 36 inches. Sensors attached to the module on the X, Y and Z axes did not exceed 5 g forces. There were no shifts in electrical performance upon retest.

Electrostatic Discharge Tests:

Surface resistivity: All materials measure greater than $10^5$ and less than $10^{12}$ ohms per square when measured at less than 10% relative.

Tribogeneration: The inside 34, 36 films do not generate static electric charges greater than 20 volts when rubbed with plastic, nylon, G-10, or polyurethane coated integrated circuit (IC) dual in-line package (DIP) samples at 0% relative humidity (desiccated).

Static decay: The protection bag 10 dissipates a 20 KV induced charge to 100 volts or less in 0.5 seconds.

Static shielding: The protection bag 10 attenuates a 10 KV discharge using the Human Body model discharge circuit to less than 20 volts inside the protection bag 10.

Electrical test: Electrical retest of the sample electronic module after wrinkling and aging resulted in less than 1% shift in electrical performance.

The testing performed on the electrostatic discharge protection bag 10 proves its effectiveness. The bumper border 18 on 3-sides of the bag provides an effective means of shock absorption of a 5 g force when the bag 10 is dropped from a height of thirty-six inches. The minimal outgassing and permanent ESD protection provides for at least a ten year shelf-life for an electronic module stored within the electrostatic discharge protection bag 10.

What is claimed is:

1. An electrostatic discharge protection bag for protecting an electronic unit comprising:
   enclosing means for enclosing said electronic unit, said enclosing means comprising a plurality of layers of materials for protecting said electronic unit against a plurality of adverse conditions including electrostatic discharge, corrosion, contamination and mechanical forces including shock; said plurality of layers of materials comprising:
   an outer layer of multilayer film with metalization sandwiched between antistatic films to provide electrostatic discharge shielding and limited electromagnetic interference attenuation;

an inner layer of corrosion inhibiting non-outgassing film; and a middle layer, disposed between the outer layer and the inner layer, of non-static generating bubble pack layers;

access means through which said electronic unit can be inserted into said enclosing means; and cushioning means disposed around a portion of said enclosing means for cushioning against mechanical forces being applied to said bag and any electronic unit inside said bag.

2. The bag as recited in claim 1 wherein said bag comprises means for holding at least one item inside said bag and separate from said electronic unit.

3. The bag as recited in claim 1 wherein said access means comprises an antistatic zip lock to open and close the bag.

4. The bag as recited in claim 1 wherein said middle layer comprises two layers of non-static generating bubble pack layers.

5. A bag for protecting an electronic unit comprising:

a first wall; and a second wall secured to said first wall thereby forming said bag;

each of said first and second wall comprising a plurality of layers of materials comprising:

an outer layer of multilayer film with metalization sandwiched between antistatic films to provide electrostatic discharge shielding and limited electromagnetic interference attenuation;

an inner layer of corrosion inhibiting non-outgassing film; and a middle layer, disposed between the outer layer and the inner layer, of non-static generating bubble pack layers.

6. The protection bag as recited in claim 5 comprising means for opening said bag for inserting said electronic unit and for closing said bag for excluding moisture and contaminating materials.

7. The protection bag as recited in claim 5 wherein said bag comprises means for holding at least one item inside said bag and separate from said electronic unit.

8. The protection bag as recited in claim 7 wherein said holding means comprises a compartment for holding a desiccant.

9. The protective bag as recited in claim 7 wherein said holding means comprises a compartment for holding a humidity indicator.

* * * * *